(12) United States Patent
Ramachandran et al.

(10) Patent No.: US 7,127,367 B2
(45) Date of Patent: Oct. 24, 2006

(54) TAILORED TEMPERATURE UNIFORMITY

(75) Inventors: Balasubramanian Ramachandran, Santa Clara, CA (US); Joseph Michael Ranish, San Jose, CA (US); Ravi Jallepally, Santa Clara, CA (US); Sundar Ramamurthy, Fremont, CA (US); Raman Achutharaman, San Jose, CA (US); Brian Haas, San Jose, CA (US); Aaron Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/950,145

(22) Filed: Sep. 24, 2004

(65) Prior Publication Data

US 2005/0102108 A1 May 12, 2005

Related U.S. Application Data

(60) Provisional application No. 60/515,037, filed on Oct. 27, 2003.

(51) Int. Cl.
*G01K 5/00* (2006.01)
*G01K 7/00* (2006.01)
*G01K 11/00* (2006.01)

(52) U.S. Cl. ..................................................... 702/130
(58) Field of Classification Search ................. 702/130
See application file for complete search history.

(56) References Cited

U.S. PATENT DOCUMENTS

| 5,399,523 | A | 3/1995 | Kakoschke |
| 5,508,532 | A | 4/1996 | Teramoto |
| 5,530,265 | A | 6/1996 | Takemura |
| 5,648,277 | A | 7/1997 | Zhang et al. |
| 5,660,472 | A | 8/1997 | Peuse et al. |
| 5,712,495 | A | 1/1998 | Suzawa |
| 5,719,065 | A | 2/1998 | Takemura |
| 5,755,511 | A | 5/1998 | Peuse et al. |
| 5,892,236 | A | 4/1999 | Takahashi et al. |
| 5,937,142 | A | 8/1999 | Moslehi et al. |
| 5,945,711 | A | 8/1999 | Takemura et al. |
| 6,001,756 | A | 12/1999 | Takahashi et al. |
| 6,013,236 | A | 1/2000 | Takahashi et al. |
| 6,087,245 | A | 7/2000 | Yamazaki et al. |
| 6,090,733 | A | 7/2000 | Otsuki et al. |
| 6,133,550 | A * | 10/2000 | Griffiths et al. ............. 219/403 |
| 6,156,628 | A | 12/2000 | Ohnuma et al. |
| 6,187,704 | B1 | 2/2001 | Takahashi et al. |
| 6,188,044 | B1 * | 2/2001 | Lee et al. ................... 219/390 |

(Continued)

FOREIGN PATENT DOCUMENTS

EP 1 197 989 A2 4/2002

(Continued)

OTHER PUBLICATIONS

U.S. Appl. No. 10/281,079 "Gas Delivery Apparatus For Atomic Layer Deposition" filed Oct. 25, 2002.

(Continued)

*Primary Examiner*—Michael Nghiem
*Assistant Examiner*—Cindy D. Khuu
(74) *Attorney, Agent, or Firm*—Patterson & Sheridan, LL (57) ABSTRACT

Method and apparatus for obtaining a tailored heat transfer profile in a chamber housing a microprocessor manufacturing process, including estimating heat transfer properties of the chamber; estimating heat absorptive properties of a wafer; adjusting the physical characteristics of the chamber to correct the heat transfer properties; and utilizing the chamber for manufacturing microprocessors.

18 Claims, 5 Drawing Sheets

U.S. PATENT DOCUMENTS

| | | | |
|---|---|---|---|
| 6,200,388 B1* | 3/2001 | Jennings | 118/728 |
| 6,214,755 B1 | 4/2001 | Otsuki et al. | |
| 6,215,106 B1 | 4/2001 | Boas et al. | |
| 6,217,969 B1 | 4/2001 | Takahashi et al. | |
| 6,261,370 B1 | 7/2001 | Otsuki et al. | |
| 6,303,411 B1 | 10/2001 | Camm et al. | |
| 6,375,348 B1 | 4/2002 | Hebb et al. | |
| 6,375,752 B1 | 4/2002 | Otsuki et al. | |
| 6,376,804 B1 | 4/2002 | Ranish et al. | |
| 6,393,210 B1 | 5/2002 | Wu | |
| 6,406,179 B1 | 6/2002 | Adams et al. | |
| 6,429,104 B1 | 8/2002 | Auberton-Herve | |
| 6,466,426 B1* | 10/2002 | Mok et al. | 361/234 |
| 6,468,879 B1 | 10/2002 | Lamure et al. | |
| 6,471,913 B1 | 10/2002 | Weaver et al. | |
| 6,476,362 B1 | 11/2002 | Deacon et al. | |
| 6,500,266 B1 | 12/2002 | Ho et al. | |
| 6,534,752 B1 | 3/2003 | Camm et al. | |
| 6,570,137 B1 | 5/2003 | Jennings | |
| 6,576,065 B1 | 6/2003 | Lamure | |
| 6,599,818 B1 | 7/2003 | Dairiki | |
| 6,853,802 B1 | 2/2005 | Neyret et al. | |
| 2001/0017294 A1 | 8/2001 | Aoki et al. | |
| 2002/0029745 A1* | 3/2002 | Nagaiwa et al. | 118/723 E |
| 2002/0096436 A1 | 7/2002 | Olgado et al. | |
| 2003/0000647 A1 | 1/2003 | Yudovsky et al. | |
| 2003/0010640 A1 | 1/2003 | Kholodenko | |
| 2003/0015141 A1 | 1/2003 | Takagi | |
| 2003/0044621 A1 | 3/2003 | Won et al. | |
| 2003/0066826 A1 | 4/2003 | Lee et al. | |
| 2003/0068903 A1* | 4/2003 | Suzuki et al. | 438/799 |
| 2003/0104664 A1 | 6/2003 | Kondo et al. | |
| 2003/0183611 A1 | 10/2003 | Gregor et al. | |
| 2003/0186563 A1* | 10/2003 | Kobayashi et al. | 438/795 |
| 2004/0126999 A1 | 7/2004 | Ramachandran et al. | |
| 2005/0078953 A1* | 4/2005 | Fodor et al. | 392/418 |

FOREIGN PATENT DOCUMENTS

WO   WO 02/061808 A2   8/2002

OTHER PUBLICATIONS

U.S. Appl. No. 10/032,284 "Gas Delivery Apparatus And Method For Atomic Layer Deposition" filed Dec. 21, 2001.

U.S. Appl. No. 60/570,173 "Atomic Layer Deposition of Hafnium-Containing High-K Materials" filed May 12, 2004.

U.S. Appl. No. 10/712,690 "Apparatus and Method for Hybrid Chemical Processing" filed Nov. 13, 2003.

U.S. Appl. No. 60/547,839 "In-Situ Dry Clean Chamber For Front End of Line Fabrication" filed Feb. 26, 2004.

U.S. Appl. NO. 10/325,673 "Method And Apparatus For Planarization of A Material by Growing A Sacrificial Film With Customized Thickness Profile" filed Dec. 19, 2002.

Invitation to Pay Additional Fees dated Feb. 2, 2005; Int'l Application PCT/US2004/034811.

PCT International Search Report dated Apr. 5, 2005 for PCT/US2004/034811.

PCT Written Opinion dated Apr. 5, 2005 for PCT/US2004/034811.

* cited by examiner

TAILORED TEMPERATURE UNIFORMITY

CROSS-REFERENCE TO RELATED APPLICATIONS

This application claims benefit of U.S. provisional patent application Ser. No. 60/515,037, filed Oct. 27, 2003, which is herein incorporated by reference.

BACKGROUND OF THE INVENTION

1. Field of the Invention

The present invention relates generally to the field of semiconductor processing and, more specifically, to thermal annealing during semiconductor device fabrication.

2. Description of the Related Art

Rapid thermal processing (RTP) is a process for annealing wafers during semiconductor fabrication. During this process, thermal radiation is used to rapidly heat a wafer in a controlled environment to a maximum temperature of over nine hundred degrees above room temperature. This maximum temperature is maintained for a specific amount of time ranging from less than one second to several minutes, depending on the process. The wafer is then cooled to room temperature for further processing. High intensity tungsten or halogen lamps are commonly used as the source of thermal radiation. Conductively coupling the wafer to a heated susceptor provides additional heat.

The semiconductor fabrication process has several applications of RTP. Such applications include thermal oxidation (a wafer is heated in oxygen or a combination of oxygen and hydrogen which causes the silicon substrate to oxidize to form silicon dioxide); high temperature soak anneal (different gas mixtures such as nitrogen, ammonia, or oxygen are used); low temperature soak anneal (typically to anneal wafers deposited with metals); and spike anneal (primarily used in processes where the wafer needs to be exposed to high temperatures for a very short time). During a spike anneal, the wafer is rapidly heated to a maximum temperature sufficient to activate a dopant and cooled rapidly to end the activation process prior to substantial diffusion of the dopant.

A method and apparatus for spike anneal is described in U.S. patent application Ser. No. 2003/0183611, published Oct. 2, 2003, which disclosure is incorporated by reference. During a spike anneal, the wafer is heated using thermal radiation from an array of lamps. Typically, the wafer is heated at a ramp rate of up to 250° C./sec to temperatures greater than 1000° C. The wafer is then cooled by conductively coupling the hot wafer to the cold reflector plate using a blanket of inert gas such as helium gas. This forced cooling facilitates a faster cooling rate, achieving ramp down rates of up to 80° C./sec.

The object of spike annealing is typically a substantially uniform temperature profile across the wafer. This is achieved by controlling an array of lamps or other heat sources which uniformly heat the wafer on the front side while a reflective surface on the back side of the wafer uniformly reflects heat back to the wafer. Emissivity measurement and compensation methodology have been used to improve the uniform temperature gradient across the substrate. However, uniform control of a spike anneal chamber often does not provide substantially uniform temperature profiles across the diameter of the wafer because the chamber components do not behave uniformly at all operating conditions. Thus, apparatus and methods to improve uniformity remain of interest.

SUMMARY OF THE INVENTION

Generally, embodiments of the present invention include apparatus and methods of obtaining a tailored heat transfer profile in a chamber housing a microprocessor manufacturing process, comprising estimating heat transfer properties of the chamber; estimating heat absorptive properties of a wafer; adjusting the physical characteristics of the chamber to correct the heat transfer properties; and utilizing the chamber for manufacturing microprocessors.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PRESENT INVENTION

A combination of approaches is used to create an RTP chamber with a controllable temperature profile that compensates for heat transfer non-uniformity in the chamber. Furthermore, a non-uniform temperature gradient can provide downstream or upstream processing correction for electrical, thickness, chemical, or crystalline imperfections in substrates. For example, a non-uniform temperature gradient can be tailored to compensate for front-side emissivity variation for individual wafers and provide improved silicon containing film deposition.

Figure 1:
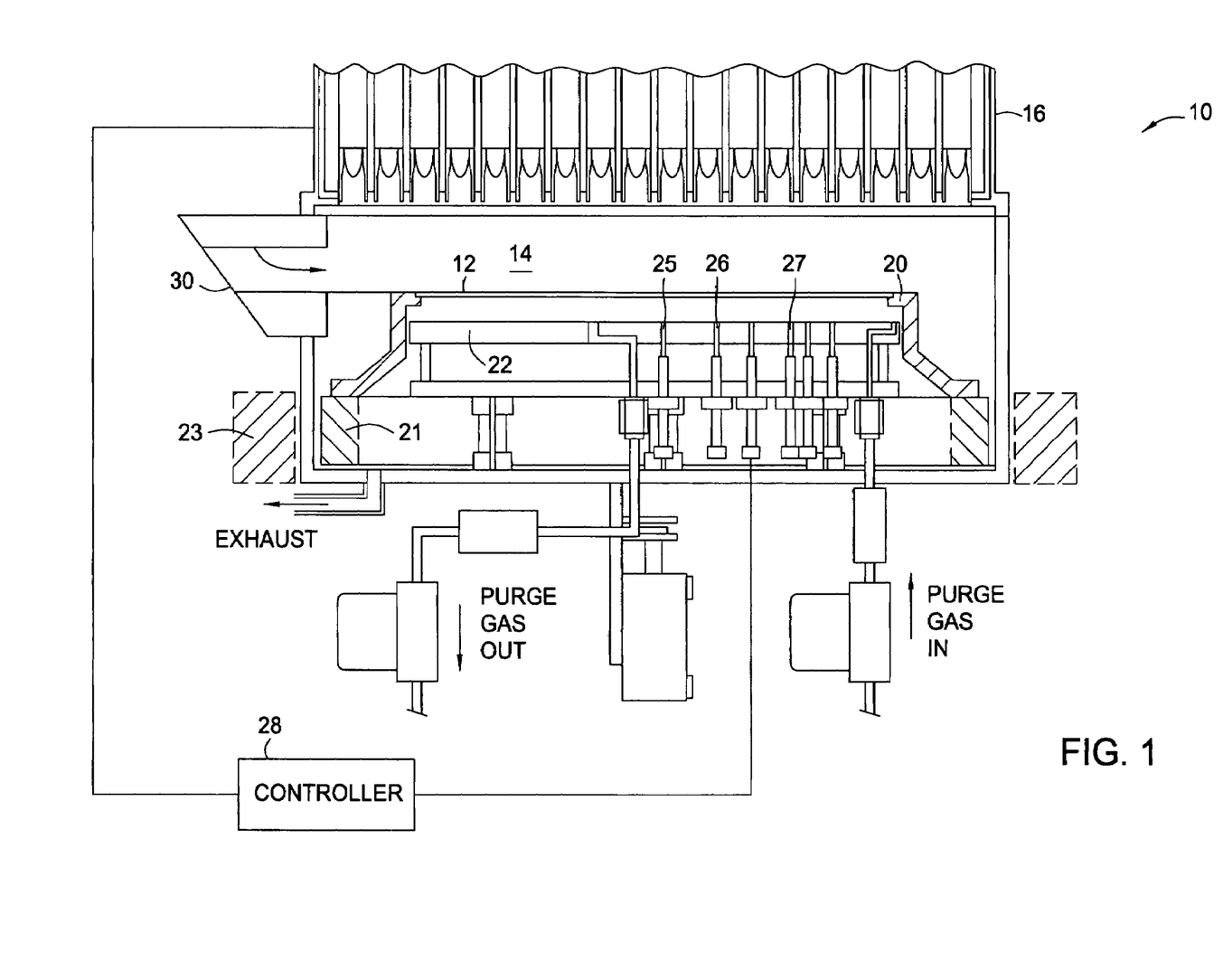
FIG. 1 is a vertical sectional view of a portion of an RTP system according to one embodiment of the present invention.

FIG. 1 illustrates how a substrate 12 is supported in a modified RTP chamber 10 having an array of UV lamps 16. The substrate 12 preferably rests on an edge ring 20 described in more detail below. A controller 28 receives measurements from pyrometers 25, 26, and 27 to output control signals to UV lamps 16 as described in more detail below.

A reflective surface 22 below the substrate 12 has openings for purge gas lines and sensors (not shown). Location of the openings and flow of purge gas may be configured to facilitate control of the temperature profile of the substrate.

Additional control of wafer non-uniformity is provided if the reflective surface 22 does not rotate as shown, although the reflective surface 22 can be designed to rotate. A stationary reflective surface 22 facilitates localized gas jet cooling and lamp adjustments.

Alternatively, the substrate 12 may be magnetically rotated by an actuator 23 that rotates a stator 21. The actuator 23 is magnetically coupled to the stator 21 and adapted to change the elevation of the stator 21 and/or to adjust the angular orientation of the stator 21 relative to its central axis. A first elevation of the stator 21 places the substrate 12 in a transfer position 14 for removal of the substrate through a slit valve 30. A new substrate is then positioned by the stator 21 for spike annealing.

Reflective surface 22 may be modified to improve a chamber's temperature tailoring capabilities by utilizing openings for pyrometers 25, 26, and 27 and a gas distribution inlet and outlet. Ejecting gas through holes (not shown) in the reflective surface 22 helps speed cooling, because a hole does not reflect energy back to the wafer. Tailoring the design of the holes in the reflector plate can provide another mechanism to facilitate heat transfer.

Figure 2:
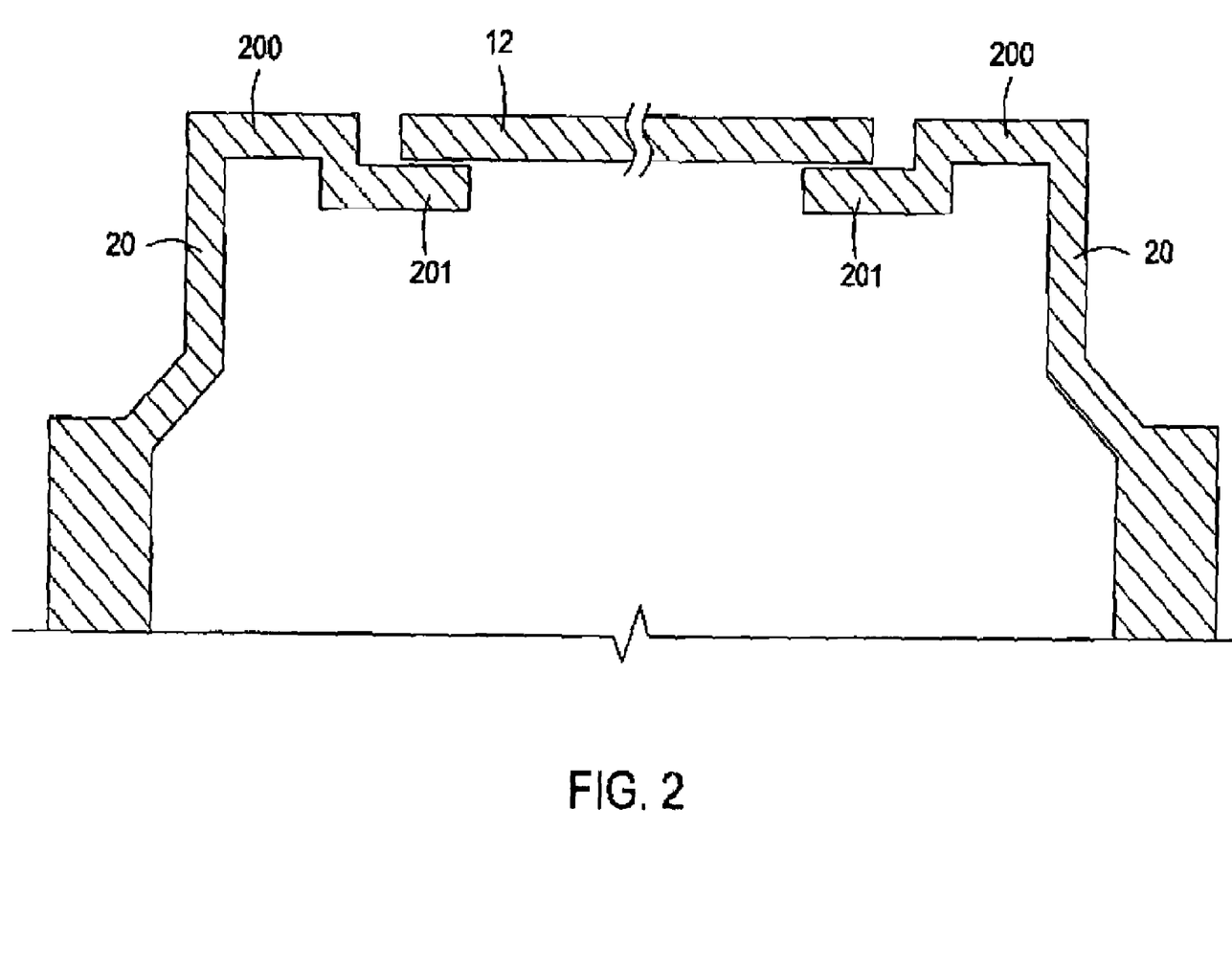
FIG. 2 is a sectional view of an embodiment of an edge ring design.

The edge ring 20 supports the substrate 12 in the RTP chamber. FIG. 2 illustrates an embodiment of edge ring 20 having a lip 201 and a flat 200. The thickness of the lip 201 and flat 200 can be varied with respect to each other and with respect to the wafer thickness.

Figure 3A:
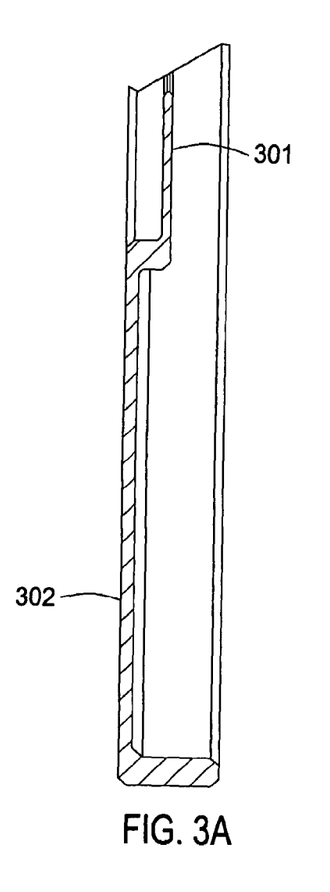
FIGS. 3A–3C are sectional views of three variations of the edge ring design.
Figure 3B:
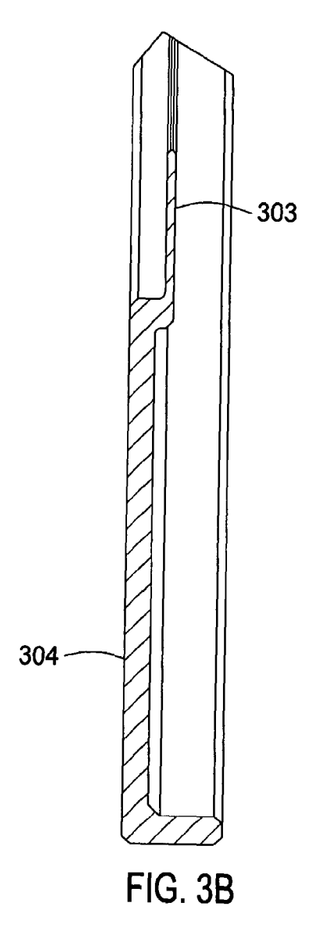
Figure 3C:
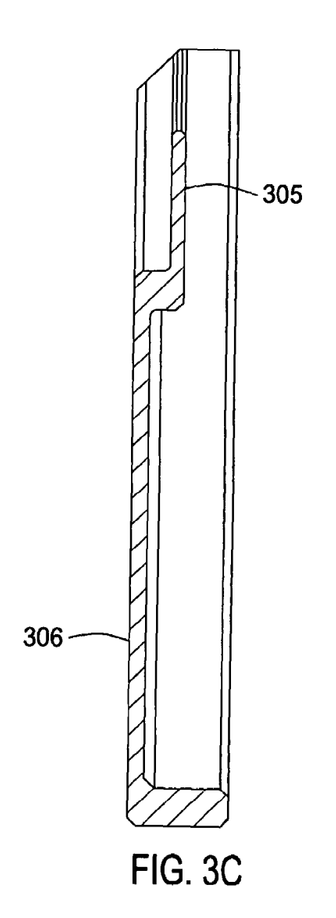

FIG. 3 shows three designs with different ratios of lip and flat thicknesses. For example, lip 301 to flat 302 has a smaller ratio than lip 303 to flat 304 but a similar ratio to lip 305 to flat 306. The ratio of substrate thickness to ring thickness is preferably between 1.14 and 1.30 for the embodiment shown in FIG. 2.

Figure 4:
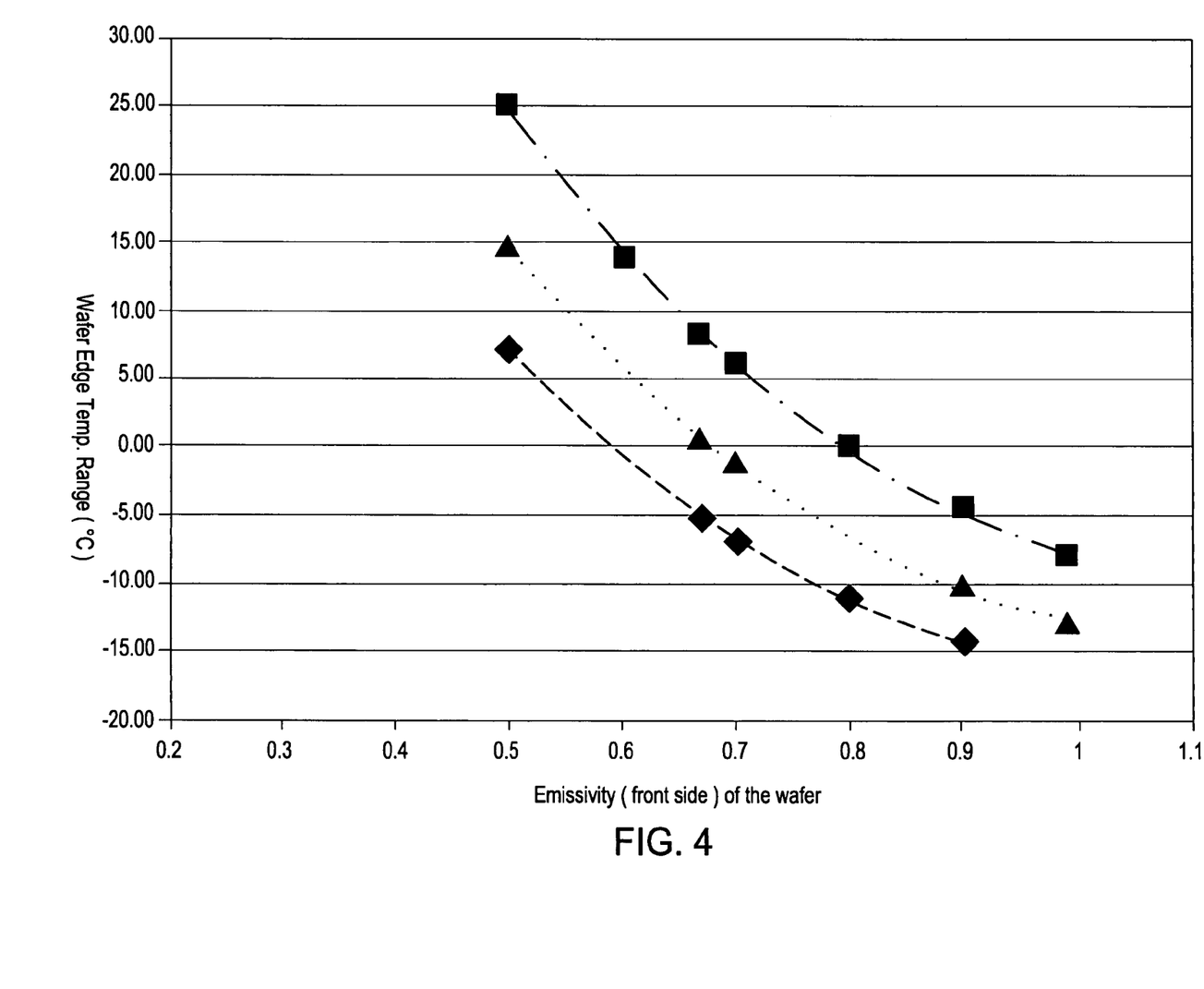
FIG. 4 is a chart of the wafer edge temperature range as a function of emissivity of the front side of the wafer.

FIG. 4 provides wafer edge temperature ranges for a variety of edge rings having different thermal mass and a variety of wafers having different emissivity. Thus, altering the thermal mass of the edge ring may result in a desired wafer edge temperature profile. The presence of coatings may distort the heat transfer properties of a chamber. Tailoring the edge ring is one way to compensate for the distortion. The lowest curve on the chart is based on data generated by a conventional system. The two highest curves are generated by data from systems that used different lip and flat thicknesses.

Figure 5:
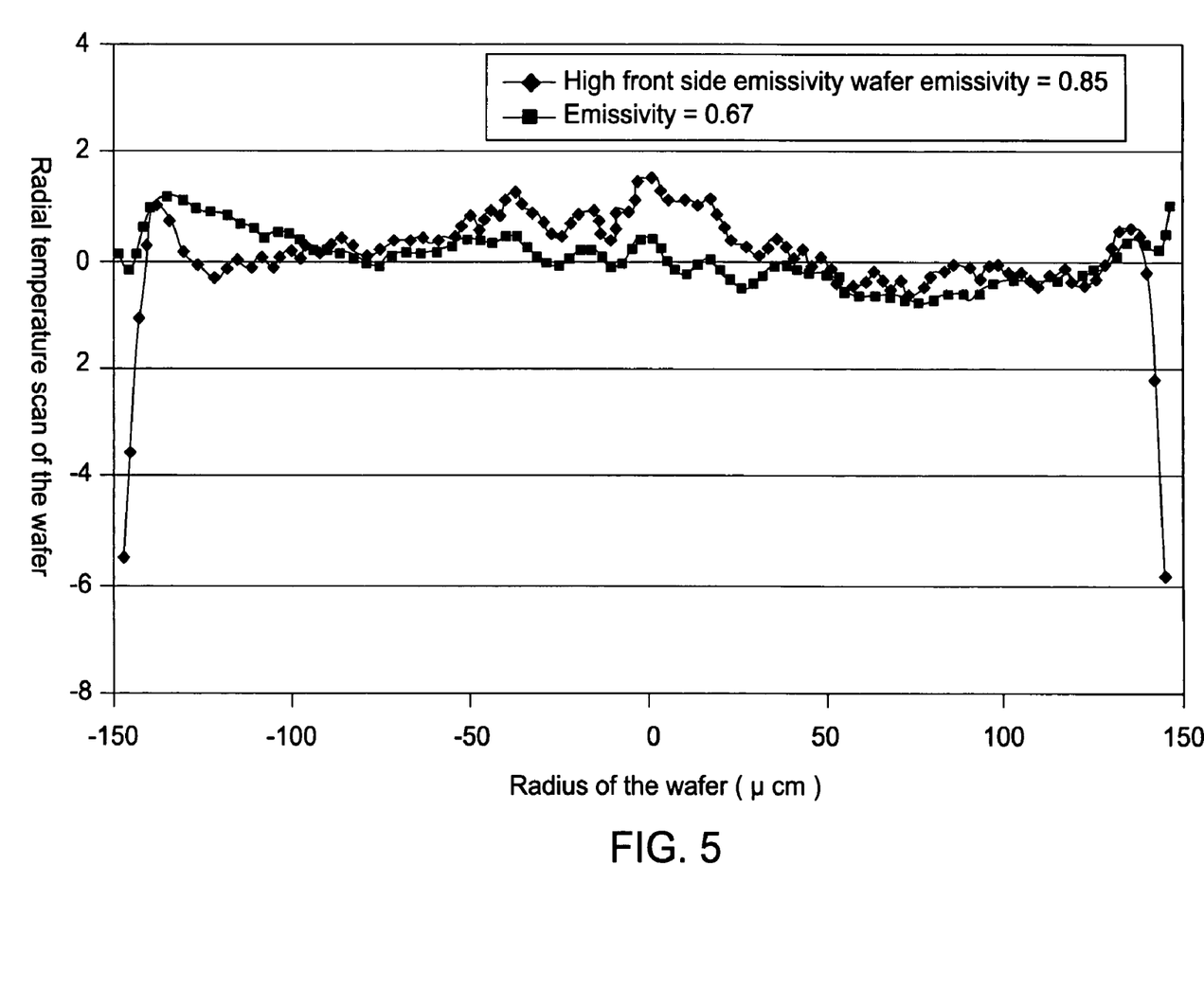
FIG. 5 is a chart of the radial temperature scan of the wafer as a function of the radius of the wafer.

FIG. 5 shows the results of a radial temperature scan of the wafer as a function of the radius of the wafer. This testing was performed at about 1000° C. The data was collected for two different emissivity surfaces. The lower front side emissivity surface had a higher and more consistent radial temperature scan across the radius of the wafer.

In operation, the following apparatus and methods may be used individually or collectively or in various combinations to create a desirable non-uniform temperature profile in the RTP chamber.

A substrate can be measured for certain characteristics such as emissivity or stack thickness prior to processing in the RTP chamber. The emissivity of the system can be either directly measured or estimated based on the stack thickness. The direct measurement of the emissivity may increase the accuracy of the compensation system. There are several options for measuring the emissivity. An internal pyrometer may be used and located within the chamber to obtain an accurate temperature of the chamber environment. The internal pyrometer may use two different feedback channels. One of the two channels would collect incident heat directly from the wafer, and the other would collect incident heat from the chamber environment or from a combination of the chamber environment and the wafer. An external reflectometer could be used to measure the reflectivity and hence the emissivity of the wafer. The chamber's internal backside emissivity can be utilized to estimate the front side emissivity of the wafer. To estimate the front side emissivity, a sacrificial wafer may to be processed upside down. The wafers that were manufactured at nearly the same time as the sacrificial wafer may be processed as though they have the same emissivity. That is, it may be assumed that the wafers that are manufactured in the same group, lot, or batch may have the same emissivity.

The results of the emissivity testing methods may be fed into a controller for some of the process parameters of the RTP chamber, and the chamber can be adjusted to obtain a desired non-uniform temperature profile that will compensate for variations in chamber or wafer design and optimize the wafer temperature distribution for a particular wafer.

Edge Ring Design

The following empirical formula models how thermal mass and emissivity at the edge and at the center of the substrate are related.

$$T_{maer} = \epsilon_{er}/\epsilon_w * t_{maw}/R$$

wherein, $T_{maer}$=thermal mass per area facing lamps for edge ring
$t_{maw}$=thermal mass per area facing lamps for substrate
$\epsilon_{er}$=emissivity of edge ring
$\epsilon_w$=emissivity of substrate, side facing lamps
R=optimum ratio, for example ~1.13 for 200 mm diameter substrate system and ~1.15 for 300 mm diameter substrate system for an edge ring such as the rings illustrated in FIGS. 3A–3C.

Thermal mass per area is the entire mass of a component times an average heat capacity divided by surface area facing the lamps. Units for thermal mass are J/K/m². Heat capacity is conveniently averaged over an anneal range of interest, typically 550° C. to 1100° C. From this empirical formula, the optimum design parameters of the ring can be calculated when the properties of the substrate are known.

For example, to design an edge ring for a 300 mm substrate with an emissivity of 0.95 and a thermal mass area facing the lamps of 1715 J/K/m² with a minimum edge temperature gradient, the edge ring is oxidized silicon carbide with an emissivity of 0.94, and the optimum ratio for a 300 mm substrate system is 1.15, the thermal mass per area facing lamps for an edge ring is 1476 J/K/m².

1. Alteration of the Edge Ring Thermal Mass

In one embodiment, the temperature profile of a substrate may be altered by using low density edge rings produced from isostatically pressed and sintered silicon carbide, such as produced by the commercially available Bridgestone flame-spray process. For improved thermal stability, the edge ring may be pre-oxidized. Also, varying the thickness of the ring across the radius of the ring leads to non-uniform resistivity that compensates for chamber and substrate variations. For example, thinner parts of the low density edge ring have faster heat transfer. Thus, the edge ring may not require a coating to control resistivity, however; various coatings can be applied to further control resistivity across the edge ring.

2. Alteration of the Edge Ring Absorptivity

The same formula from above illustrates how the heat capacity and radiation profile may influence the choice of coating and material of construction for the edge ring. When the emissivity of the edge ring is altered, the other components of the equation may be effected.

A. Material of Construction

Prior edge rings use CVD grown carbide having a silicon coating that resulted in the edge ring being transparent to the infrared sensors. It is more desirable to use a low density edge ring comprising a pressed, sintered silicon carbide containing nitrogen to avoid a transparency problem that may arise when the ring does not reflect of the chamber's heat. The porous edge ring is obtained by sintering a mixture of a powder of silicon carbide and a nonmetallic auxiliary sintering agent in a flame spray process. The material may provide more uniform heat transfer because the density is more uniform; the nitrogen that escapes the material is less detrimental to the process than the gas that escapes from the carbide, and light transmission is more desirable.

B. Coatings

Coatings may also be used on the edge ring to tailor the temperature gradient in the chamber. Adding nitride or graphite coatings may increase the emissivity. Other coatings such as polysilicon may be used to increase reflection to increase the cooling in the chamber. Varying the thickness of the coating may also influence the reflectivity of the edge ring. Coatings may influence the chamber's heat transfer profile more markedly if the substrate is not rotated.

Introduction of Multiple Gas Jets Directed onto the Edge Ring or Wafer

Purge gas jets discharging on the wafer or edge ring may produce localized cooling. The number and location of the jets, the nature of the gas, and the velocity of the gas can be adjusted for the amount and extent of cooling. The velocity and composition of each jet could be programmed individually if desired. Altering the radial gas flows and compositions could create radial gradients of temperature.

Local Alterations of the Reflector Plate Reflectivity

Control of the wafer temperature profile can be improved by selectively coating the reflective surface 22 with aluminum, aluminum oxide, or other materials. Changing the surface area of the reflective surface 22 with holes or other shapes cut into the reflector or adding tape or bolts to the surface of the reflector plate can be used to tailor the temperature profile. Furthermore, geometric approaches such as blistering or dimpling the reflector plate can be used alone or in combination with a coating to further improve the wafer temperature profile.

Use of Offset Temperatures to Develop Radial Temperature Gradients Using the Lamp Control System Ordinarily, the UV lamps 16 and reflector 22 are designed to produce a relatively uniform irradiance on the wafer. This irradiance distribution can be arbitrarily adjusted with radial symmetry by deliberately altering the offset temperatures. Placing the lamps off center is desirable for heat distribution and for better convection for wafer cooling. Also, radial locations on the wafer where higher temperatures are desired could have the corresponding lamp locations comprised of higher power lamps, while the adjacent, cooler locations can be comprised of lower power lamps, or in some locations the lamps may be removed. Where increased temperature gradients are required, reflectors producing narrower beams upon reflection could be used to decrease the radiation spread from one control zone to another.

The chamber could also be engineered to radiate additional power through certain lamps or certain zones of lamps. This additional power could be used to tailor the temperature profile on the wafer as desired. If the wafer were rotating with respect to the lamp head, then these engineered temperature profiles would mainly consist of non-uniform temperature profiles along the radius of the wafer. Radial locations where non-uniformity is desired could have the corresponding lamps increase or decrease in power as desired. Altering the lamp parameters could be used to compensate for the difference in edge temperature range effect caused by wafers of different emissivities.

Localized Introduction of Different Lamp Reflectors

Reflectors may be conditionally arranged hexagonally to reflect uniformly onto a rotated wafer. Also, the center lamp of the bank of lamps does not have the same reflector pattern behind it as the other lamps because of space limitations.

Diffusive optics are possible with center bulbs that are coated or sandblasted. Other zones may benefit by using diffusive optics to control the direct radiation on the wafer. That is, accentuating the boundary between the substrate and the edge ring might be desirable. Ways to modify the bulb and reflector system may also include modifying the coil or taper angles of the bulb.

Localized Alteration of the Wafer-Reflector Plate Separation

Localized alteration of the wafer-reflector plate separation is helpful for adjusting the conductive cooling mechanism. By altering the wafer-reflector plate separation, the blackbody effectiveness may be improved. Improving the blackbody effectiveness may also improve temperature measurement. Adjusting the view angle, the angle the gas enters through the reflector plate, can also improve cooling.

Localized Alteration of the Thermal Conductivity of the Medium Between the Wafer and Reflector Plate Altering the thermal conductivity of the medium between the wafer and the reflector plate can also help tailor the temperature profile in the chamber. The location of the gas outlets in the region can be varied. The flow rate of the gas can be varied. Also, the conductivity of the gas can be improved by selecting gases based on their conductivity and molecular weight. Additionally, the concentration of different gases can also be used to improve cooling control. For example, 100% Xe; 50% Xe and 50% He; and 100% He outlets in different parts of the reflective surface might be desirable. Finally, the exit and entrance ports might also be modified for uneven gas distribution.

Placement of Protrusions on the Edge Ring to Enhance Turbulence

Placing protrusions on the edge ring to enhance turbulence may also help tailor the temperature profile of the chamber.

Additionally, an individual substrate-by-substrate approach may be used to compensate for variation in substrate front side emissivity profiles. That is, the emissivity of the individual device wafers can be used to set the desired temperature variation across the substrate to correct the undesirable variation in the emissivity of individual substrates.

A non-uniform temperature profile could also be useful in developing different devices or product types on a particular wafer. Processor speeds and other characteristics on the resultant devices depend on temperature and the duration of the high temperature exposure that that particular device observes during a spike anneal. By engineering the temperature profile, different areas on the wafer could yield different devices with different processor speeds.

The wafer edge temperature range was varied as a function of the ratio of edge ring heat transfer rate and wafer heat transfer rate for a 300 mm wafer and the results were plotted. Wafer edge temperature range is the temperature difference between a point near the wafer edge and the nearest temperature measurement across the diameter of the wafer. Two correlation lines were drawn to estimate the correlation and accuracy of the data. The equation for the similar radial distribution has a lower correlation factor than the equation for the different flat thickness distribution. That is, the model for the different flat thicknesses distribution is more accurate than the similar radial distribution model. Thus, altering the edge ring thermal mass may change the ratio of heat transfer rates.

Testing to determine how the wafer edge temperature varies as a function of the ratio of an edge ring heat transfer rate and a wafer heat transfer rate for a 200 mm wafer was performed. As the edge ring heating rate was increased compared to the wafer heat transfer rate, the wafer edge temperature range increased linearly with a correlation of greater than 95 percent. This indicates that the heat transfer process can be tailored by selecting the edge ring heat transfer properties.

While the foregoing is directed to the preferred aspects of the invention, other and further aspects of the invention may be devised without departing from the basic scope thereof, and the scope thereof is determined by the claims that follow.

The invention claimed is:

1. A method of obtaining a tailored heat transfer profile in a chamber housing a microprocessor manufacturing process, comprising:
   estimating heat transfer properties of the chamber;
   estimating heat absorptive properties of a wafer;
   adjusting the physical characteristics of the chamber based on the estimated chamber and wafer properties to correct the heat transfer properties of the chamber by altering a thermal mass of an edge ring supporting the wafer wherein the thermal mass is altered by changing at least one of a thickness or density of the edge ring; and
   utilizing the chamber for manufacturing microprocessors.

2. The method of claim 1, wherein the heat transfer properties are also adjusted by utilizing the edge ring comprising pressed, sintered silicon carbide containing nitrogen.

3. The method of claim 1, wherein the heat transfer properties are also adjusted by utilizing an edge ring comprising a ratio of edge ring thickness to substrate thickness of 1.14 to 1.30.

4. The method of claim 1, wherein the heat transfer properties are also adjusted by altering placement of openings in a reflective surface.

5. The method of claim 1, wherein the heat transfer properties are also adjusted by varying the power supplied to the lamps in the chamber.

6. A method for tailoring heat transfer within a chamber for microprocessor manufacturing, comprising:
   measuring heat transfer properties of the chamber;
   measuring emissivity of a substrate to be processed in the chamber;
   adjusting the physical characteristics of the chamber based on the measured heat transfer properties and emissivity by altering a thermal mass of an edge ring to correct the heat transfer properties between the chamber and the substrate wherein the thermal mass is altered by changing at least one of a thickness or density of the edge ring; and
   utilizing the chamber for manufacturing microprocessors.

7. The method of claim 6, wherein the edge ring comprises pressed, sintered silicon carbide containing nitrogen.

8. The method of claim 6, wherein the edge ring comprises a ratio of edge ring thickness to substrate thickness of 1.14 to 1.30.

9. The method of claim 6, wherein the heat transfer properties are also adjusted by altering placement of openings in a reflective surface.

10. The method of claim 6, wherein the heat transfer properties are also adjusted by varying power supplied to lamps in the chamber.

11. The method of claim 6, wherein adjusting the physical characteristics of an edge ring modifies the heat transfer properties to reduce a temperature drop near a wafer edge to less than one degree Celsius.

12. A method for tailoring heat transfer within a chamber for microprocessor manufacturing, comprising:
   adjusting location, volume, contents, or pressure of gas flows into or out of the chamber;
   adjusting reflectivity of a reflective surface in the chamber;
   measuring heat transfer properties of a substrate disposed in the chamber based on the adjustment of the gas flows and the reflectivity; and
   adjusting thermal mass of an edge ring to correct heat transfer properties of the substrate wherein the thermal mass is altered by changing at least one of a thickness or density of the edge ring.

13. The method of claim 12, further comprising adjusting location or material of construction for lamps within the chamber and lamp power to obtain the desired temperature profile.

14. The method of claim 12, wherein the edge ring comprises pressed, sintered silicon carbide containing nitrogen.

15. The method of claim 12, wherein the edge ring comprises a ratio of edge ring thickness to substrate thickness of 1.14 to 1.30.

16. The method of claim 12, wherein the reflectivity of the reflective surface is adjusted by altering placement of openings in a reflective surface.

17. The method of claim 12, wherein the chamber is adjusted to reduce a temperature drop near a wafer edge to less than one degree Celsius.

18. A method of obtaining a tailored heat transfer profile in a chamber housing a microprocessor manufacturing process, comprising:
   estimating heat transfer properties of the chamber by measuring the temperature of the environment in the chamber;
   estimating heat absorptive properties of a wafer by measuring the emissivity of the wafer;
   adjusting the physical characteristics of the chamber based on the measured temperature and emissivity to correct the heat transfer properties of the chamber and altering a thermal mass of an edge ring supporting the wafer wherein the edge ring comprises a ratio of edge ring thickness to substrate thickness of 1.14 to 1.30; and
   utilizing the chamber for manufacturing microprocessors.

* * * * *